(12) United States Patent
Rangarajan et al.

(10) Patent No.: US 8,810,322 B2
(45) Date of Patent: *Aug. 19, 2014

(54) APPARATUS AND METHOD FOR FREQUENCY GENERATION

(75) Inventors: Rajagopalan Rangarajan, San Diego, CA (US); Chinmaya Mishra, San Diego, CA (US); Maulin Bhagat, San Diego, CA (US); Zhang Jin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/295,683

(22) Filed: Nov. 14, 2011

(65) Prior Publication Data

US 2012/0068777 A1 Mar. 22, 2012

Related U.S. Application Data

(63) Continuation of application No. 12/477,651, filed on Jun. 3, 2009, now Pat. No. 8,058,934.

(51) Int. Cl.
*H03B 1/00* (2006.01)
*H03B 5/08* (2006.01)
*H03K 3/354* (2006.01)

(52) U.S. Cl.
USPC ............. 331/46; 331/48; 331/68; 331/108 D; 331/167; 331/179

(58) Field of Classification Search
USPC .......... 331/46, 48, 68, 108 D, 117 D, 117 FE, 331/117 R, 167, 168, 177 R, 179, 36 C
See application file for complete search history.

(56) References Cited

U.S. PATENT DOCUMENTS

| 6,081,030 A | 6/2000 | Jaouen et al. |
| 6,621,365 B1 | 9/2003 | Hallivuori et al. |

(Continued)

FOREIGN PATENT DOCUMENTS

| EP | 1962342 | 8/2008 |
| JP | 2002252324 A | 9/2002 |

(Continued)

OTHER PUBLICATIONS

International Search Report and Written Opinion—PCT/US2010/037326—ISA/EPO—Apr. 20, 2011.

(Continued)

*Primary Examiner* — Levi Gannon
(74) *Attorney, Agent, or Firm* — S. Hossain Beladi

(57) ABSTRACT

A wideband frequency generator has two or more oscillators for different frequency bands, disposed on the same die within a flip chip package. Coupling between inductors of the two oscillators is reduced by placing one inductor on the die and the other inductor on the package, separating the inductors by a solder bump diameter. The loosely coupled inductors allow manipulation of the LC tank circuit of one of the oscillators to increase the bandwidth of the other oscillator, and vice versa. Preventing undesirable mode of oscillation in one of the oscillators may be achieved by loading the LC tank circuit of the other oscillator with a large capacitance, such as the entire capacitance of the coarse tuning bank of the other oscillator. Preventing the undesirable mode may also be achieved by decreasing the quality factor of the other oscillator's LC tank and thereby increasing the losses in the tank circuit.

22 Claims, 9 Drawing Sheets

(56) References Cited

U.S. PATENT DOCUMENTS

| | | | |
|---|---|---|---|
| 7,173,498 B2 * | 2/2007 | Ramaswamy et al. | 331/108 C |
| 7,423,495 B2 | 9/2008 | Bevilacqua et al. | |
| 7,508,280 B2 * | 3/2009 | Gabara | 331/181 |
| 8,058,934 B2 * | 11/2011 | Rangarajan et al. | 331/46 |
| 8,125,282 B2 * | 2/2012 | Bao et al. | 331/117 D |
| 2003/0060177 A1 | 3/2003 | Noboru et al. | |
| 2007/0075798 A1 | 4/2007 | Amano | |
| 2010/0072572 A1 | 3/2010 | Baumgartner et al. | |

FOREIGN PATENT DOCUMENTS

| | | |
|---|---|---|
| JP | 2002539612 A | 11/2002 |
| JP | 2003110425 A | 4/2003 |
| JP | 2003249865 A | 9/2003 |
| JP | 2004014645 A | 1/2004 |
| JP | 2004015444 A | 1/2004 |
| JP | 2004112750 A | 4/2004 |
| JP | 2004120728 A | 4/2004 |
| JP | 2005522861 A | 7/2005 |
| JP | 2005303839 A | 10/2005 |
| JP | 2006211529 A | 8/2006 |
| JP | 2007104152 A | 4/2007 |
| JP | 2008060342 A | 3/2008 |
| TW | 200705795 A | 2/2007 |
| WO | 0054337 A1 | 9/2000 |
| WO | WO2009022991 A1 | 2/2009 |

OTHER PUBLICATIONS

Taiwan Search Report—TW099117987—TIPO—May 21, 2013.

* cited by examiner

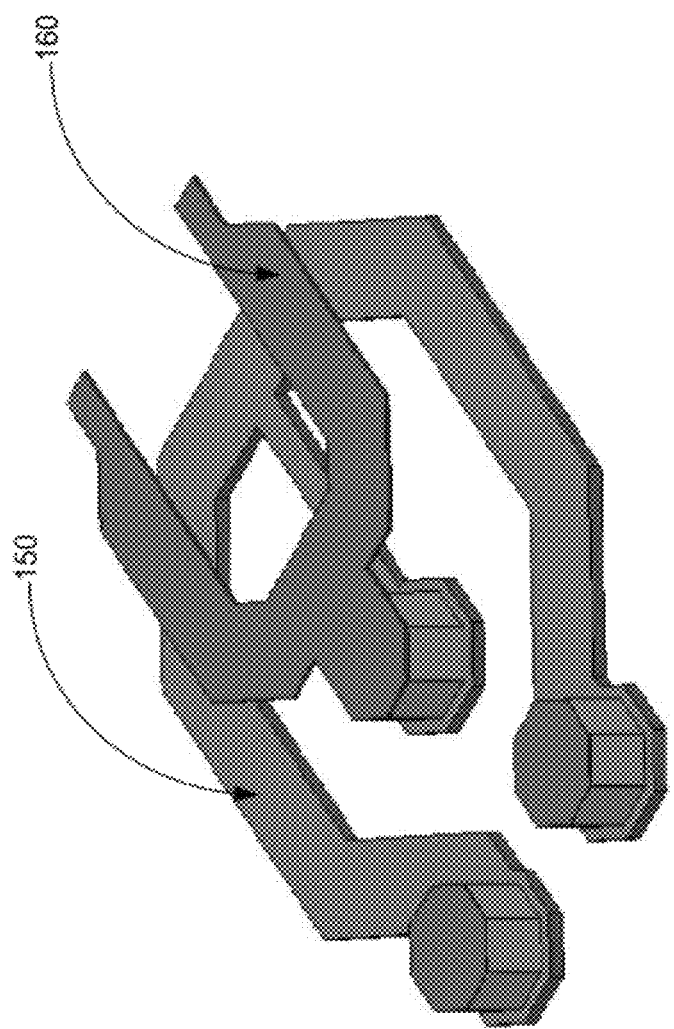

APPARATUS AND METHOD FOR FREQUENCY GENERATION

BACKGROUND

1. Field

Apparatus and methods described in this document relate to frequency generators and methods for frequency generation. More specifically, the apparatus and methods relate to frequency generation using multiple oscillators.

2. Background

Tunable frequency generators are used in many different electronic devices. Wireless communication devices, for example, use frequency generators for upconversion of transmitted signals to intermediate and RF frequencies, and for downconversion of received signals to intermediate and baseband frequencies. Because operating frequencies vary, the generators' frequencies need to be tunable.

Frequency coverage required for multiple communication standards and multiple bands typically necessitates wide tuning range oscillators, such as voltage controlled oscillators (VCOs) and digitally controlled oscillators (DCOs). The extent of an oscillator's tuning range is one important performance parameter. It is often desirable to increase the tuning range, for example, in order to cover multiple bands.

Other performance criteria of tunable oscillators include phase noise performance, power consumption, and size. The different performance criteria are sometimes competing.

Conventional tunable oscillators may be tuned by applying a varying biasing voltage to a variable capacitor (varactor or varicap), and by switching capacitors in the oscillator inductance-capacitance (LC) tank. For a variety of reasons, the frequency range of a single oscillator obtained through these capacitance-varying techniques is limited. For this reason, multiple tunable oscillators may need to be used within the same device. Especially in the case of portable devices, such as cellular handset and other handheld communication devices, it is often desirable to implement an oscillator on the same integrated circuit (IC or chip).

Inductors (the "L" in the "LC") occupy substantial area of a small IC. It is, of course, desirable to reduce the physical size of ICs. Locating two or more LC oscillators on the same IC therefore presents certain design difficulties. Thus, it is desirable to reduce the IC area occupied by the inductors of the multiple oscillators. Furthermore, it may be desirable to reduce the coupling between or among the inductors of the different oscillators built on the same IC.

Given the physical proximity of the inductors located on the same IC, however, can make substantial inductor-to-inductor coupling difficult to avoid. Such coupling may result in unwanted oscillation modes of a particular oscillator, in addition to the desired oscillation mode resulting from the resonance of the LC tank of the oscillator. It may be desirable to suppress such additional oscillation modes, so that the particular oscillator will generate frequencies based on its own LC tank.

Therefore, there is a need in the art for tunable oscillators with extended frequency range. There is also a need in the art for reducing the size of the IC packages containing multiple tunable oscillators. There is an additional need in the art for suppressing undesirable modes of oscillation in oscillators with non-trivial coupling between their inductors.

SUMMARY

Embodiments disclosed herein may address one or more of the above stated needs by locating the inductor of the first oscillator on the die of a flip chip integrated circuit (IC), and locating the inductor of the second oscillator on the package of the IC. Varying the capacitance in the LC tank of one of the oscillators may extend the tunable range of the other oscillator within the same package, by changing the oscillation mode. Controlling the capacitance and/or the quality factor (Q) of the LC tank of one of the oscillators in a certain way may suppress undesirable oscillation modes of the other oscillator where the inductors of the LC tanks of the two oscillators are loosely coupled.

In an embodiment, a flip chip includes a die with electronic circuitry of a first oscillator, electronic circuitry of a second oscillator, and a first inductor of the first oscillator. The flip chip also includes a package with a second inductor of the second oscillator.

In an embodiment, an integrated circuit includes electronic circuitry of a first oscillator, a first inductor configured for use in an LC tank of the first oscillator, electronic circuitry of a second oscillator, a second inductor configured for use in an LC tank of the second oscillator, and a second oscillator control module. The second inductor is loosely coupled to the first inductor. The second oscillator control module is configured to switch a second capacitance into the LC tank of the second oscillator when the second oscillator is inactive. Switching the second capacitance causes oscillation mode of the first oscillator to change from a first mode to a second mode.

In an embodiment, a method of generating signals includes providing a first oscillator having a first inductor configured for use in an LC tank of the first oscillator. The method also includes providing a second oscillator having a second inductor configured for use in an LC tank of the second oscillator. The method additionally includes operating a second oscillator control module configured to switch a second capacitance into the LC tank of the second oscillator when the second oscillator is inactive. Switching the second capacitance into the LC tank of the second oscillator causes oscillation mode of the first oscillator to change from a first mode to a second mode.

In an embodiment, an integrated circuit includes electronic circuitry of a first oscillator, a first inductor configured for use in an LC tank of the first oscillator, electronic circuitry of a second oscillator, a second inductor configured for use in an LC tank of the second oscillator, and a means for causing oscillation mode of the first oscillator to change from a first mode to a second mode when the second oscillator is inactive. The second inductor is loosely coupled to the first inductor.

In an embodiment, a flip chip includes a die having electronic circuitry of a first oscillator, electronic circuitry of a second oscillator, and a first inductor of the first oscillator. The flip chip also includes a second inductor of the second oscillator. The flip chip further includes a means for packaging the die and keeping the second inductor loosely coupled to the first inductor.

In an embodiment, an electronic device includes a first oscillator with a first LC tank. The first LC tank includes a first inductor. The electronic device also includes a second oscillator with a second LC tank. The second LC tank has a second inductor. The second inductor is magnetically loosely coupled to the first inductor. The electronic device further includes a coarse tuning circuit for coarse tuning the second oscillator by selectively switching capacitors from a capacitor bank into the second LC tank. The coarse tuning circuit is configured to switch all capacitors of the bank into the second LC tank when the first oscillator is operating and the second oscillator is not operating in order to suppress tendency of the first oscillator to oscillate in an undesirable mode.

In an embodiment, an electronic device includes a first oscillator with a first LC tank. The first LC tank has a first inductor. The electronic device also includes a second oscillator with a second LC tank. The second LC tank has a second inductor. The second inductor is magnetically loosely coupled to the first inductor. The electronic device further includes a first quality factor reducing circuit coupled to the first LC tank. The first quality factor reducing circuit is configured to reduce quality factor of the first LC tank when the second oscillator is operating and the first oscillator is not operating, in order to suppress tendency of the second oscillator to oscillate in an undesirable mode.

In an embodiment, an electronic device has a first oscillator and a second oscillator. The first oscillator has a first LC tank with a first inductor. The second oscillator has a second LC tank with a second inductor. The second inductor is magnetically loosely coupled to the first inductor. The electronic device also includes a means for reducing quality factor of the first circuit when the second oscillator is operating and the first oscillator is not operating in order to suppress tendency of the second oscillator to oscillate in an undesirable mode.

In an embodiment, a method is disclosed for operating a frequency generator with a first oscillator and a second oscillator, where the second oscillator has a plurality of capacitors for coarse tuning the second oscillator. The inductors of the LC tanks of the two oscillators are loosely coupled. The method includes activating the first oscillator while not activating the second oscillator, and loading LC tank of the second oscillator with the plurality of capacitors when activating the first oscillator.

In an embodiment, a method of operating a frequency generator having a first oscillator and a second oscillator includes activating the first oscillator while not activating the second oscillator, and loading LC tank of the second oscillator with an energy dissipating element when activating the first oscillator.

In an embodiment, a method of operating a frequency generator that has a first oscillator and a second oscillator includes activating the first oscillator while not activating the second oscillator, and a step for reducing quality factor of a tank circuit of the second oscillator to reduce tendency of the first oscillator to oscillate in an undesirable mode.

These and other embodiments and aspects of the present invention will be better understood with reference to the following description, drawings, and appended claims.

BRIEF DESCRIPTION OF THE DRAWINGS

FIGS. 1C and 1D are perspective views of an exemplary juxtaposition of loop inductors of the flip chip structure of FIGS. 1A and 1B;

DETAILED DESCRIPTION

Figure 1A:
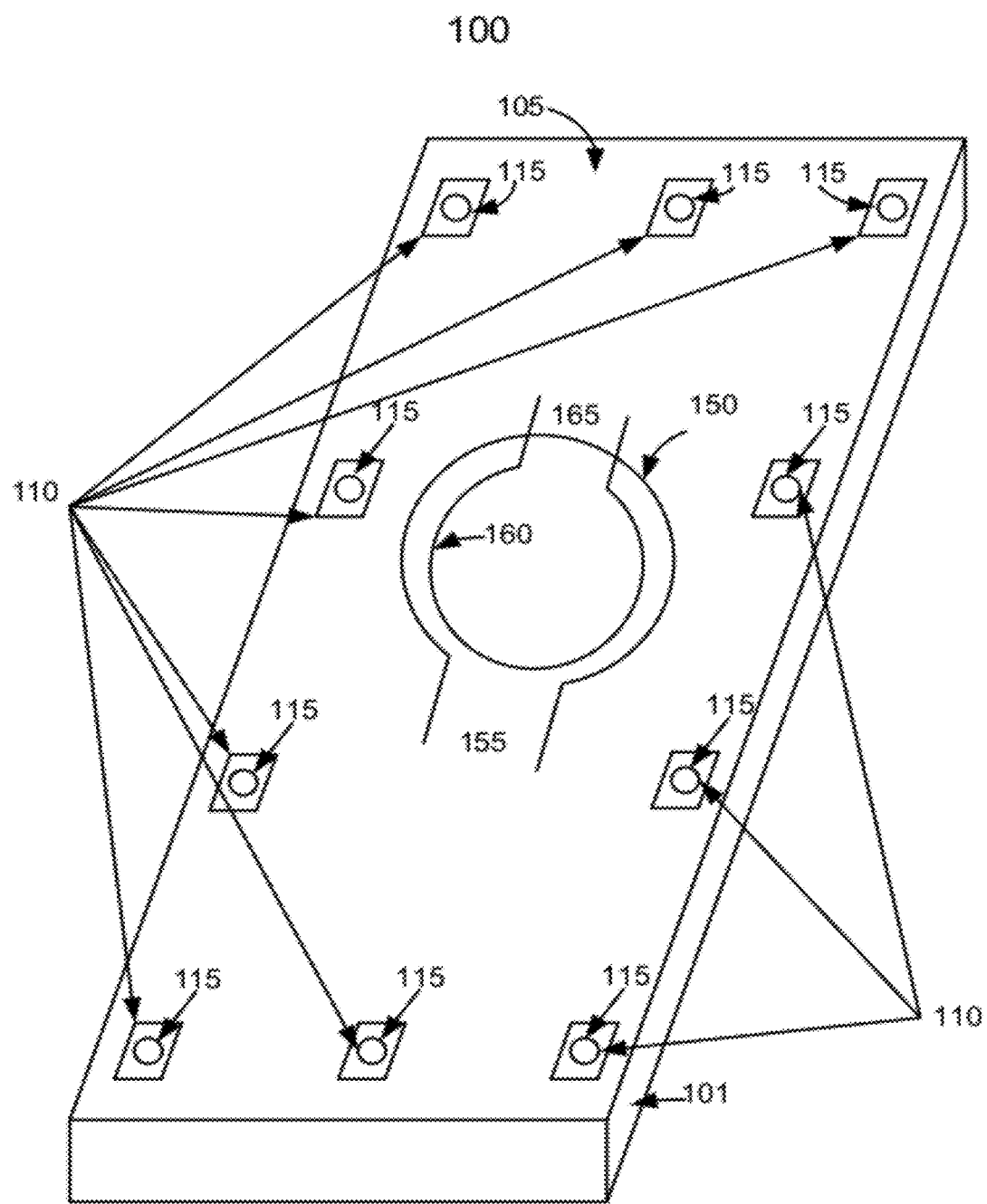
FIGS. 1A and 1B illustrate selected elements of a flip chip structure of an integrated circuit implementing two oscillators.

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expression "alternative embodiment" and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the invention in any manner.

"Loosely coupled" and similar expressions referring to magnetic coupling of coils or loops means magnetic coupling (as used in transformer theory) with a coupling coefficient (k) of less than 0.25. It should be noted that in some below-described embodiments the coupling coefficient of coils or loops described as "loosely coupled" may be less than 0.2; less than 0.15; and less than 0.10.

"Common mode" resonance refers to resonance (or oscillation) of an oscillator LC tank that includes a first loop inductor of a pair of loosely coupled loop inductors wherein the current in a second loop inductor of the pair of loop inductors flows so that the flux of the second loop inductor generally adds to the flux of the first loop inductor. "Differential mode" resonance refers to oscillation wherein the two fluxes tend to subtract or negate each other. For substantially concentric loop inductors described below, the currents in the two loop indictors flow in generally the same direction in the common mode oscillation; the currents flow in generally opposite directions in the differential mode oscillation.

A "loop" inductor need not form a closed circle, but may form a partial circle. Moreover, it need not be strictly circular, but may be part of a polygonal shape, such as a hexagon or an octagon.

The "VCO" and "DCO" designations may be used interchangeably within the description, each referring to a tunable oscillator, particularly where the oscillator is tunable through varying of the capacitance of the oscillator's LC tank.

Figure 1B:
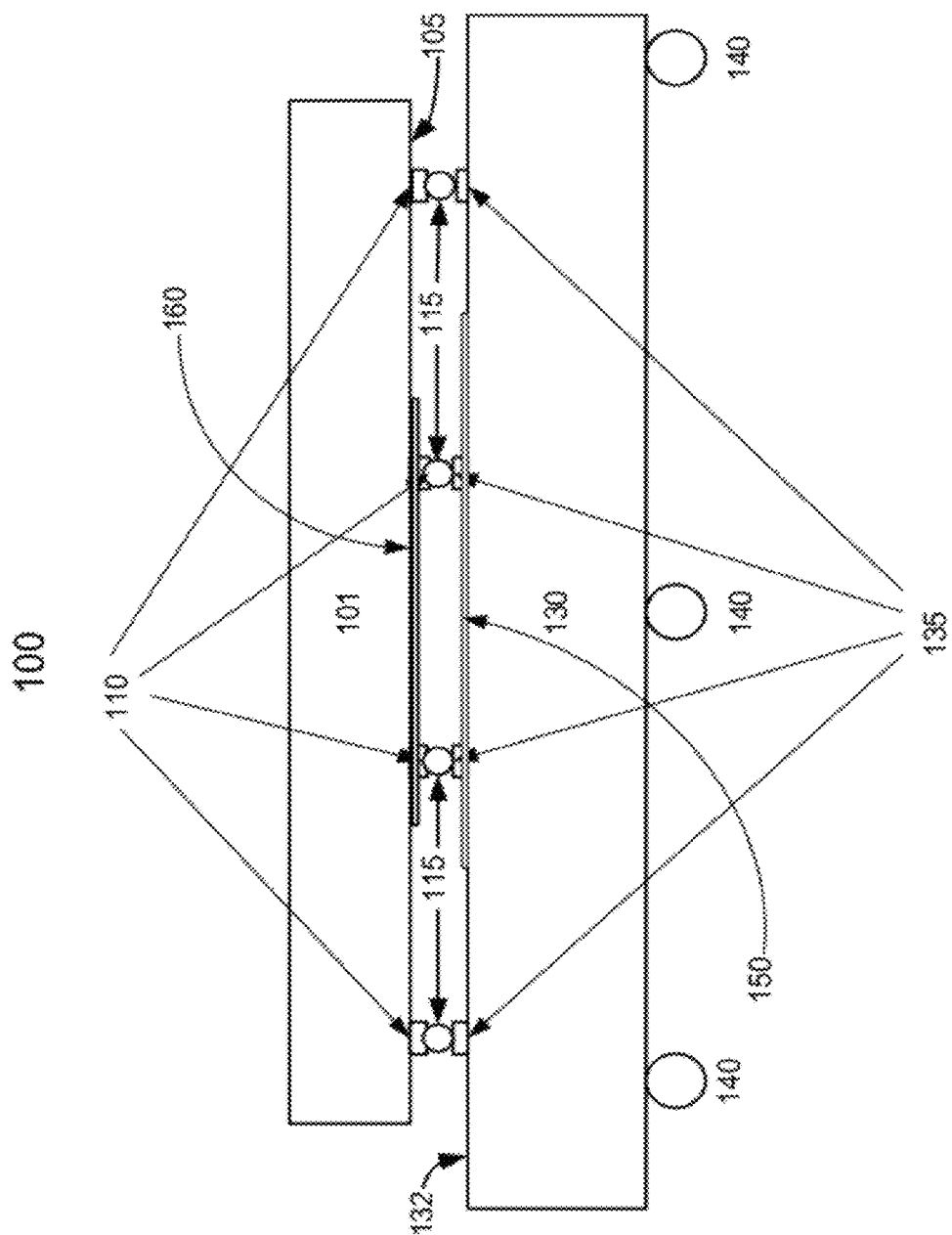

FIGS. 1A and 1B illustrate selected elements 100 of a flip chip structure of an integrated circuit implementing two oscillators. The outputs of the two oscillators may be independently (alternatively) selectable, for example, if the oscillators are parts of a wideband frequency generator. The FIG. 1A is a perspective view of the structure without its package 130, while FIG. 1B is a cross-sectional view that includes the package 130. The flip chip structure includes a die 101 with electronic circuitry and bond pads 110 formed on a first surface 105 of the die 101. Solder bumps 115 are deposited or otherwise formed on the pads 110. Electrical connections between some or all of the electrical components of the oscillator circuitry on the die 101 are made by soldering or otherwise connecting the bumps 115 to pads 135 of the package 130. As a person of skill in the art would understand after perusal of this document, the die 101 may contain electronic circuitry in addition to the circuitry of the oscillators described herein; electrical connections to such additional electronic circuitry may be made using electrical traces in the die 101 and/or vias connecting various layers of the die 101, and/or otherwise. One side of the package would thus adjoin and be parallel to the first surface 105 of the die 101, as is apparent from the cross-sectional view in FIG. 1B. The pads 135 of the package 130 are connected to connecting elements (e.g., pins or balls) 140, which thus connect the circuitry of the die 101 to devices external to the flip chip structure 100.

It should be noted that, in the above-described embodiments, various electronic components (such as decoupling capacitors) may be formed on a packaging substrate, and be coupled to the electronic components on the die 101 through solder bumps 115.

The structure 100 includes an inductor 160 in the form of a loop formed on the surface 105 of the die 101. The inductor 160, which may be deposited on the die 101, is connected to other devices of the die 101 by connecting elements 165. This inductor is part of an LC tank of a first oscillator in the structure 100. A second inductor 150 in the form of a loop is formed on a surface 132 of the package 130 that faces the surface 105 of the die 101. In other words, the surface 132 is the surface on which the pads 135 are formed. The inductor 150 is connected to other devices of the die 101 by connecting elements 155, the pads 135, the solder bumps 115, and the pads 110. The inductor loop 150 is concentric or substantially concentric (e.g., within manufacturing process tolerances) with the inductor loop 160. The inductors 150 and 160 may both be of the same essential shape, such as circular, hexagonal, or octagonal, or their respective shapes may differ. Note that here the inductors 150 and 160 are stacked and the vertical distance between them (i.e., the distance between the centers of the inductors along the line normal to the planes of the surfaces 105 and 132) is approximately equal to the diameter of the bumps 115, and the separation between the inductors is greater than the separation available between any two metallization layers on the die 101. In this way, the magnetic coupling between the two inductors may be reduced, for example, to a value less than 0.25, less than 0.2, and/or less than 0.15. The two inductors 150 and 160 may thus become loosely coupled.

Figure 1D:
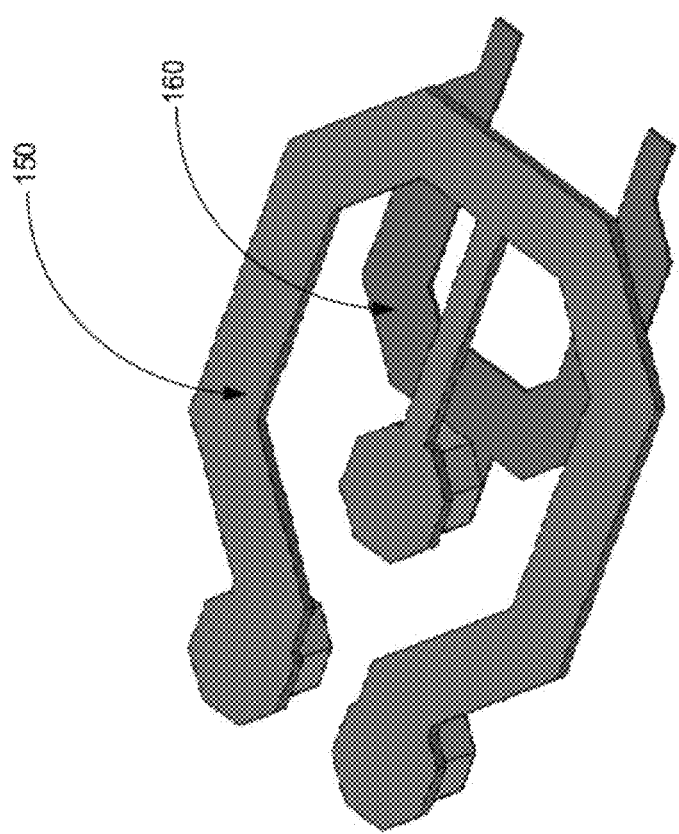

FIGS. 1C and 1D are perspective views of an exemplary juxtaposition of the inductor loops 150 and 160 of the structure 100.

It should be noted that in some embodiments, the two loops are not necessarily substantially concentric, and are not necessarily disposed on the surfaces 105 and 132 as is shown in FIG. 1.

Loose coupling of the inductors 150 and 160 of the two oscillators may be used advantageously to increase the tuning range of each of the two oscillators built on the same chip or otherwise in proximity of each other. (Proximity here means a distance causing loose coupling of the inductors.) Let us consider a case where the first oscillator that uses the first inductor 160 has a tuning range higher than the tuning range of the second oscillator using the second inductor 150. Note that in embodiments the frequency relationship may be reversed. We will refer to the higher frequency oscillator as an "HF oscillator" and to the lower frequency oscillator as an "LF oscillator" in the description below. Note that in embodiments the frequency tuning ranges of the two oscillators overlap; in other embodiments, they merely adjoin each other; and in still other embodiments, there is a gap between the ranges.

Because of the loose coupling of the HF and LF oscillators, the resonance of either oscillator will be affected by the state of the LC tank of the other oscillator. Thus, varying the capacitance of the LC tank of the HF oscillator will generally change the tuning range of the LF oscillator, and varying the capacitance of the LC tank of the LF oscillator will generally change the tuning range of the HF oscillator.

For a pair of LC oscillators with loosely coupled inductors, one of the oscillators tends to oscillate in the common mode when the resonant frequency of its LC tank is lower than the resonant frequency of the LC tank of the other oscillator. The first oscillator tends to oscillate in the differential mode when the resonant frequency of its LC tank is higher than the resonant frequency of the LC tank of the other oscillator. These statements are general in nature, and the transitions between the common and differential modes are not abrupt and do not necessarily occur precisely when the LC tank resonant frequencies cross over. But the general principle holds for oscillators with loosely coupled inductors.

Figure 2:
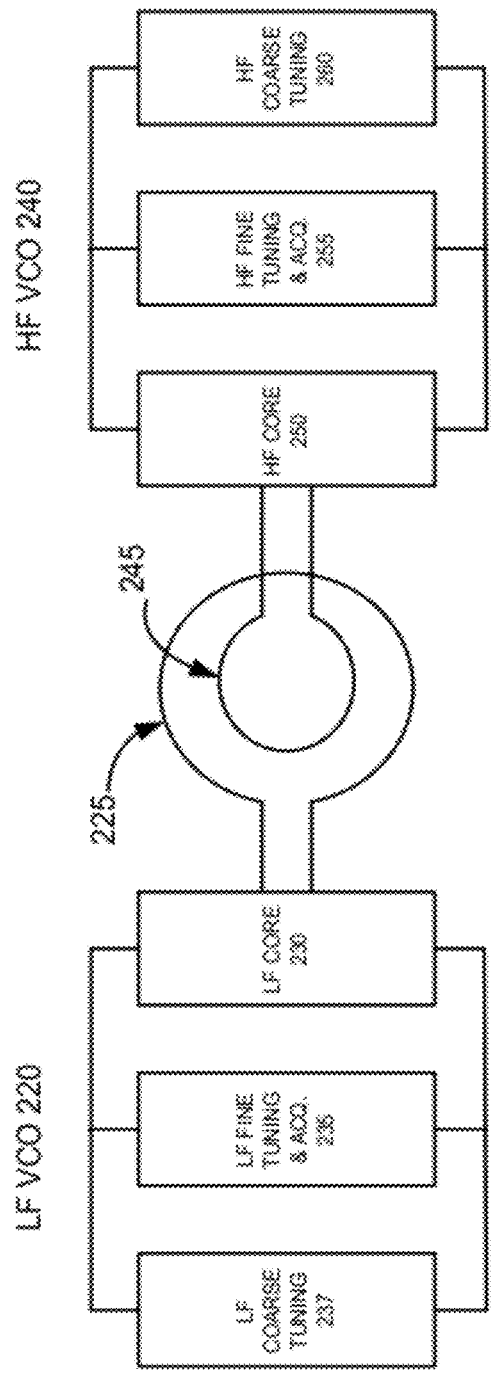
FIG. 2 is a block diagram illustrating selected components of a frequency generator with two digitally controlled oscillators.

FIG. 2 is a block diagram illustrating selected components of a frequency generator 200 made with two digitally controlled oscillators 220 and 240, which can be operated selectively to cover a wide frequency band. The low frequency oscillator 220 includes an LF coarse tuning module 237, an LF fine tuning and acquisition module 235, an LF core 230, and an inductor 225, which may be the inductor 150 from FIGS. 1A and 1B. The high frequency oscillator 240 includes an HF coarse tuning module 260, an HF fine tuning and acquisition module 255, an HF core 250, and an inductor 245, which may be the inductor 160 from FIGS. 1A and 1B. The low frequency oscillator 220 may be implemented using a first negative transconductance (negative Gm) circuit, and the high frequency oscillator may be implemented using a second negative Gm circuit. The first negative Gm circuit may be part of the LF core 230, and the second negative Gm circuit may be part of the HF core 250.

When the output of a particular oscillator (either 220 or 240) is selected as the output of the generator 200, the core of that oscillator operates the coarse and fine tuning modules of the oscillator to select the required frequency within the band of the oscillator. Each of the fine and coarse tuning modules may be implemented as a bank of switchable capacitors, as is known.

The HF core 250 and the HF coarse tuning module 260 can be configured to bring the resonant frequency of the LC tank of the HF VCO 240 below the highest resonant frequency of the LC tank of the LF VCO 220. In this configuration, the HF VCO 240 may loose some performance characteristics that it possesses within its normal frequency band of operation. But it is the LF VCO 220 that is selected now for operation, not the HF VCO 240. The "crossover" of the HF VCO 240 LC tank resonant frequency below that of the LC tank of the LF VCO 220 advantageously switches the mode of the LC tank of the LF VCO 220 from common to differential. Consequently, the top frequency obtainable from the LF VCO 220 now moves up, beyond that normally achievable from the LF VCO 220. The tuning range of the LF VCO 220 is broadened beyond its normal operating band, i.e., beyond the frequency band that the LF VCO 220 could provide in the absence of the coupling between the inductors of the two oscillators.

Analogously, the LF core 230 and the LF tuning modules 235 and 237 can be configured to bring the resonant frequency of the LC tank of the LF VCO 220 above the lowest resonant frequency of the LC tank of the HF VCO 240. In this configuration, the LF VCO 220 may loose some performance characteristics that it possesses within its normal frequency band of operation. But it is the HF VCO 240 that is selected now for operation, rather than the LF VCO 220. The "crossover" of the LF VCO 220 LC tank resonant frequency above that of the LC tank of the HF VCO 240 advantageously switches the mode of the LC tank of the HF VCO 240 from differential to common Consequently, the low frequency obtainable from the HF VCO 240 now moves lower, below that normally achievable from the HF VCO 240. The tuning range of the HF VCO 240 is thus broadened beyond its normal operating band, i.e., beyond the frequency band that the HF VCO 240 could provide in the absence of the coupling between the inductors of the two oscillators.

In a particular simulated design example, the low end frequency of a tunable LF VCO is about 2.8 GHz. The high end frequency of the LF VCO is about 3.94 GHz when a tunable HF VCO with a loosely coupled inductor is configured so that the resonant frequency of its LC tank is above the cross over frequency, so that the LF VCO operates in the common mode. When the HF VCO is configured so that the resonant frequency of its LC tank is below the crossover frequency (i.e., below the frequency of the LF VCO), the high end of the LF VCO frequency band shifts up to about 4.13 GHz. In the same example, the high end frequency of the HF VCO tuning range is at about 5.5 GHz. The low end of the HF VCO tuning range is at about 3.82 GHz when the LF VCO is configured so that the resonant frequency of the LC tank of the LF VCO is below the cross over frequency. The low end of the HF VCO tuning range shifts down to about 3.7 GHz when the LF VCO is reconfigured so the resonant frequency of its LC tank moves above the crossover frequency, i.e., the resonant frequency of the LC tank of the LF VCO moves above the frequency of the HF VCO.

In practice, the HF VCO may include a large capacitor $C_{Hext}$ that, when switched into a parallel combination with other components of the HF VCO (the inductor and any other capacitors that may at the same time appear in the LC tank of the HF VCO, such as the stray capacitances and the switchable capacitors of the HF tuning modules 255 and 260), may bring the resonant frequency of the LC tank of the HF VCO below the crossover frequency at the top or somewhat below the top of the normal tuning range of the LF VCO. Analogously, the LF VCO may include a capacitor $C_{Lext}$ that, when switched out of the parallel combination with the inductor of the LF VCO (leaving stray capacitances that may at the same time appear in the LC tank of the LF VCO and possibly some other capacitances such is those of one of the tuning modules), may bring the resonant frequency of the LC tank of the LF VCO above the crossover frequency at the bottom or somewhat above the bottom of the normal tuning range of the LF VCO. It should be noted that the "normal" range of the LF VCO is typically with the $C_{Lext}$ capacitor in the circuit, and the normal range of the HF VCO is typically without the $C_{Hext}$ capacitor in the circuit. The capacitor $C_{Hext}$ may be a separate capacitor, or it may be realized as a combination of capacitors within the HF Coarse Tuning Module 260, and possibly in the Fine Tuning Module 255. The capacitor $C_{Lext}$ may be a separate capacitor, or it may be realized as one or a combination of capacitors within the LF Fine Tuning Module 235. After perusing this document, a person skilled in the art should be able to come up with similar ways to bring the resonant frequency of the LC tank of the HF VCO below the top of the tuning range of the LF VCO, and to bring the resonant frequency of the LC tank of the LF VCO above the bottom of the tuning range of the HF VCO. For example, switchable inductors may be used.

As noted above, there is a need to prevent unwanted oscillation modes in oscillators of a frequency generator that includes two (or possibly more) oscillators in order to cover a wide tuning range. This need is typically most acute when the inductors of the oscillators are magnetically coupled with a relatively high coupling coefficient, but the need may arise in other cases, including in the oscillators described above. We describe two approaches for reducing the tendency of one of two loosely coupled oscillators to oscillate in an undesirable mode. One approach is to load the LC tank of the other oscillator of the generator with a large capacitance. The second approach is to reduce the quality factor (Q) of the LC tank of the other oscillator.

Figure 3:
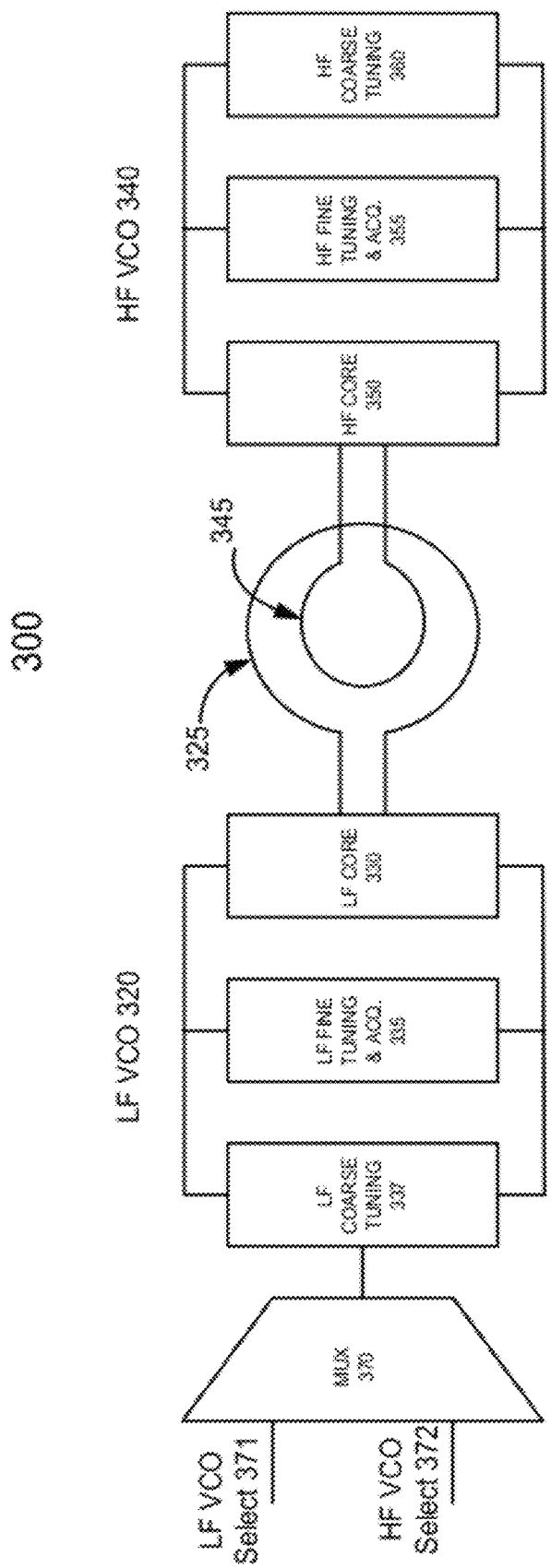
FIG. 3 illustrates selected components of a frequency generator configured to suppress undesired oscillation modes.

FIG. 3 illustrates selected components of a frequency generator 300 configured in accordance with the first approach. Most of the components of the generator 300 may be similar to the analogous components of the generator 200 described above. Note that the inductors 325 and 345 may or may not be disposed as shown in FIGS. 1A and 1B. For example, the inductors 325 and 345 may be both disposed on the same die.

When the generator 300 enables the HF VCO 340, it loads the unused LC tank of the LF VCO 320 with a large capacitance, for example, with the entire coarse tuning bank of the module 337. Fewer than all coarse tuning capacitors may also be used for loading the unused LC tank of the LF VCO 320. An additional capacitor may also be used to load the unused LC tank. The frequency generator 300 also includes a multiplexer 370, which is configured to selectively load the LC tank of the LF VCO 320 with the entire or partial coarse tuning bank 337. The generator is configured so that the MUX 370 loads the LC tank of the LF VCO 320 in response to a signal received on its input 372, which may be the HF VCO select signal. When the generator 300 selects the LF VCO, the MUX 370 transmits the code corresponding to the desired coarse tuning of the LF VCO 320 to the LF Coarse Tuning Module 337.

Figure 4:
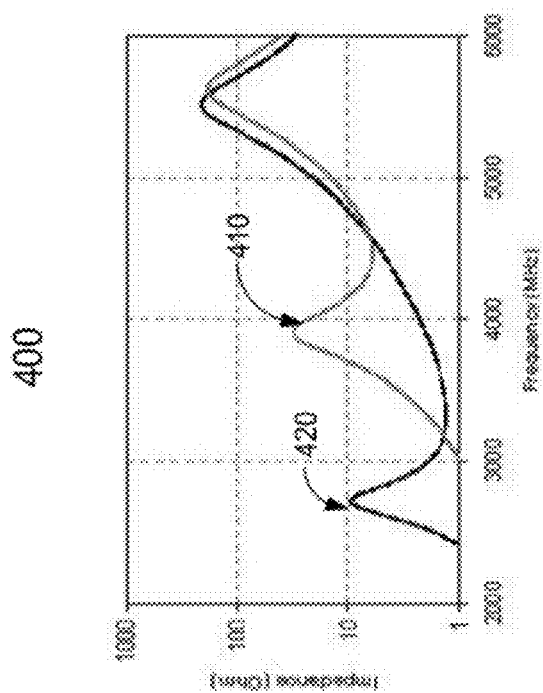
FIG. 4 illustrates selected aspects of examples of impedance curves of the LC tank of one of the oscillators of the frequency generator shown in FIG. 3.

FIG. 4 illustrates selected aspects of examples of impedance curves of the LC tank of the HF VCO 340. The first curve 410 is a typical impedance curve where the LC tank of the LF VCO is not loaded with the entire coarse tuning bank. Note the relatively pronounced secondary impedance peak around 4000 MHz. The second curve 420 is the impedance curve of the same HF VCO 340, but with the LF VCO LC tank loaded with the entire coarse tuning bank. Note that the secondary peak has shifted lower in the frequency spectrum, and also became less pronounced. The frequency shift away from the primary peak makes the unwanted mode oscillation less likely, as does the suppression of the magnitude of the secondary peak.

Figure 5:
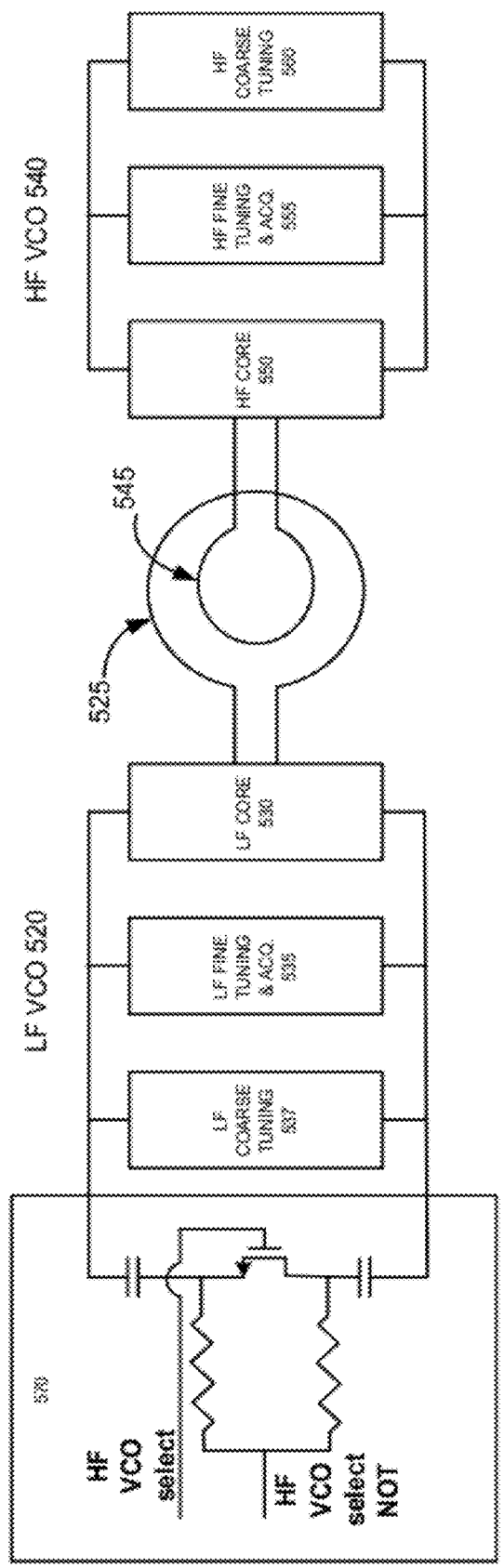
FIG. 5 illustrates selected components of another frequency generator configured to suppress undesired oscillation modes.

The other approach is to reduce the Q of the unused LC tank. This approach may be used in both low frequency and high frequency oscillators. FIG. 5 illustrates selected components of a generator 500 where this approach is implemented in the LF VCO 520. Most of the components of the generator 500 may be similar to the analogous components of the generator 300 described above, but with the Q loading circuit 570 replacing the MUX 370. When the HF VCO 540 is selected (HF VCO select is active), the Q loading circuit 570 essentially closes a "bad" switch and inserts a dissipating element across the LC tank of the LF VCO 520. When the LF VCO 520 is operating, the switch is open and the LF VCO operates normally.

Figure 6:
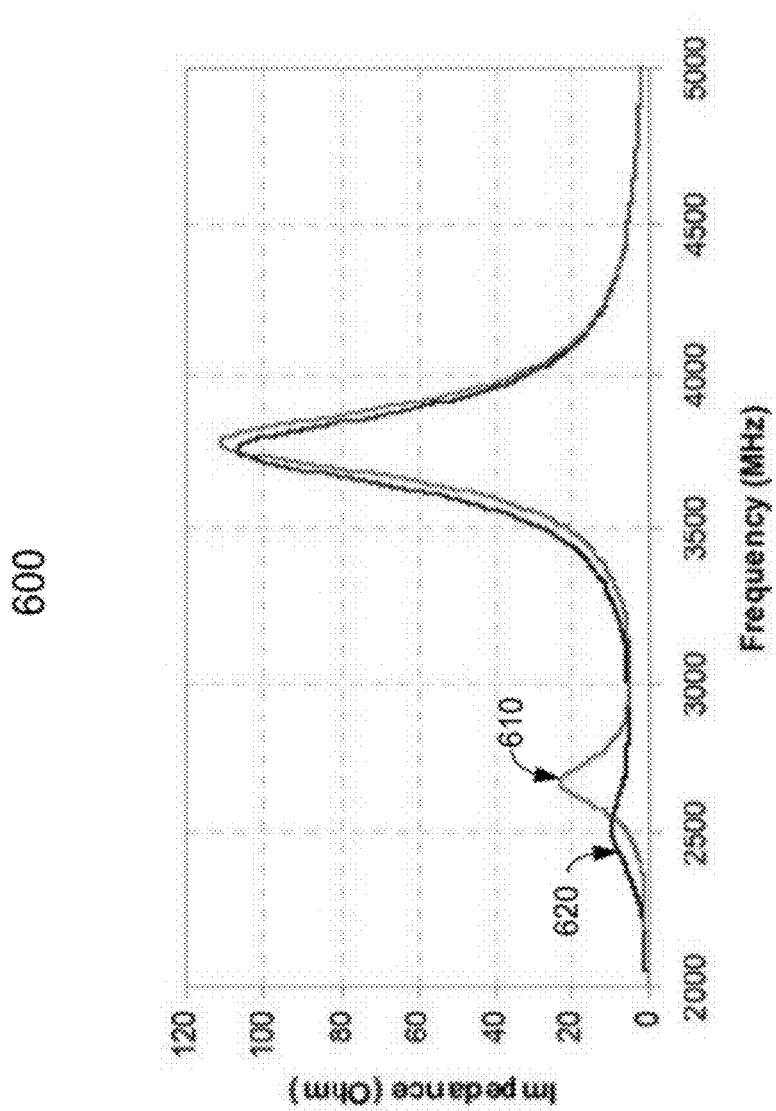
FIG. 6 illustrates selected aspects of examples of impedance curves of the LC tank of one of the oscillators of the frequency generator shown in FIG. 5.

FIG. 6 illustrates selected aspects of examples of impedance curves of the LC tank of the HF VCO 540. The first curve 610 is the same as the curve 410, with the relatively pronounced secondary peak around 4000 MHz. The second curve 620 is the impedance curve of the same HF VCO 540, but with the Q of the LF VCO LC tank reduced by the circuit 570. Here as well the secondary peak has shifted lower in the frequency spectrum and became somewhat less pronounced, making the unwanted mode oscillation less likely.

It should be noted that the oscillators of the above-described embodiments may include more than a single coil in its LC tank. For example, an oscillator may include two, three, or a higher number of coils.

The apparatus and methods described in this document can be used in various electronic devices, including, for example, access terminals operating within a cellular radio network transporting voice and/or data packets between multiple access terminals of the network, or between the access terminals and devices connected to additional networks outside the access network. In particular, the apparatus and methods may be used in the local oscillator frequency source of an access terminal.

Although steps and decisions of various methods may be described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the particular sequences described and/or shown in the accompanying Figures. Furthermore, not every illustrated step and decision may be required in every embodiment or variant, while some steps and decisions that have not been specifically illustrated may be desirable in some embodiments/variants.

Those of skill in the art would understand that some embodiments described herein require a flip-chip kind of package, but that in other embodiments the use of flip-chip packages is optional. Thus, the embodiments that prevent (or reduce the possibility of) unwanted oscillations through LC resonant frequency and/or quality factor manipulations may but need not be implemented in flip-chip packages.

Those of skill in the art would understand that an inductor of a first LC combination of a first oscillator may be placed on or in the package, while an inductor of a second LC combination of a second oscillator may be placed on a surface of the die facing the package, on another surface of the die, or on an intermediate layer of the die between the two surfaces of a multilayer die. In some embodiments, each of the inductors may be selectively placed on either surface or on any of the intermediate layers of a multilayer die.

Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make and use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. An apparatus comprising:
   first oscillator circuitry;
   a first inductor configured to electrically interact with the first oscillator circuitry;
   a package comprising a second inductor;
   a plurality of solder bumps configured to separate the first inductor from the second inductor, wherein the first inductor and the second inductor are magnetically loosely coupled; and an oscillator control module configured to switch a capacitance into second oscillator circuitry when the second oscillator circuitry is inactive.

2. The apparatus of claim 1, wherein the magnetic coupling coefficient of the first and the second inductors is less than 0.2.

3. The apparatus of claim 1, wherein the magnetic coupling coefficient of the first and the second inductors is less than 0.15.

4. The apparatus of claim 1, wherein the magnetic coupling coefficient of the first and the second inductors is less than 0.10.

5. An apparatus comprising:
an intermediate layer;
first oscillator electronic circuitry;
second oscillator electronic circuitry;
a first inductor disposed on the intermediate layer and configured to electrically interact with the first oscillator circuitry;
a package comprising a second inductor;
a plurality of solder bumps separating the first inductor from the second inductor configured to electrically interact with the second oscillator electronic circuitry, wherein the first inductor and the second inductor are magnetically loosely coupled; and
an oscillator control module configured to switch a capacitance into the second oscillator electronic circuitry when the second oscillator electronic circuitry is inactive.

6. The apparatus of claim 5, wherein the first and second inductors are substantially concentrical.

7. The apparatus of claim 5, wherein the package comprises a first surface facing the first oscillator electronic circuitry and the second inductor is disposed on the first surface of the package.

8. An apparatus comprising:
first oscillator electronic circuitry;
a first inductor configured for use with a first capacitance;
second oscillator electronic circuitry;
a second inductor configured for use with a second capacitance, the second conductor loosely coupled to the first inductor; and
an oscillator control module configured to switch a third capacitance into the second oscillator when the second oscillator is inactive.

9. The apparatus of claim 8, wherein switching the third capacitance causes an oscillation mode of the first oscillator to change from a first mode to a second mode and wherein the first mode is a common mode, and the second mode is a differential mode.

10. The apparatus of claim 9, wherein switching the third capacitance causes an oscillation mode of the first oscillator to change from a first mode to a second mode and wherein the first mode is a differential mode, and the second mode is a common mode.

11. The apparatus of claim 10, further comprising a fine tuning module comprising a bank of capacitors for selective switching into the second oscillator to tune the second oscillator, wherein the oscillator control module for the second oscillator is configured to cause the fine tuning module for the second oscillator to switch one or more capacitors of the bank into the second oscillator.

12. The apparatus of claim 10, wherein the third capacitance is not used to tune the second oscillator during operation of the second oscillator.

13. The apparatus of claim 9, further comprising an oscillator control module configured to switch a fourth capacitance into an LC tank of the first oscillator when the first oscillator is inactive, wherein switching the fourth capacitance into the LC tank of the first oscillator causes the oscillation mode of the second oscillator to change from the second mode to the first mode.

14. The apparatus of claim 9, wherein the first oscillator circuitry is fabricated on a die, the second oscillator circuitry is fabricated on the die, the die comprises a first surface, a second surface, and at least one intermediate layer disposed between the first surface and the second surface, the first inductor is disposed on the first surface, the second surface, or the at least one intermediate layer, and the second inductor is disposed on the first surface, the second surface, or the at least one intermediate layer.

15. The apparatus of claim 9, further comprising a package, wherein the first oscillator electronic circuitry is fabricated on a die, the second oscillator electronic circuitry is fabricated on the die, the die comprises a first die surface, a second die surface, and at least one intermediate layer disposed between the first die surface and the second die surface, the package comprising a package surface facing the die, the first inductor is disposed on the first die surface, the second die surface, the at least one intermediate layer, or the package surface, and the second inductor is disposed on the first die surface, the second die surface, the at least one intermediate layer, or the package surface.

16. The apparatus of claim 8, further comprising a coarse tuning module for the second oscillator comprising a bank of capacitors for selective switching into the second oscillator to tune the second oscillator, wherein the oscillator control module for the second oscillator is configured to cause the coarse tuning circuit for the second oscillator to switch all capacitors of the bank.

17. The apparatus of claim 8, further comprising a coarse tuning module for the second oscillator comprising a bank of capacitors for selective switching into the second oscillator to tune the second oscillator, wherein the oscillator control module for the second oscillator is configured to cause the coarse tuning circuit for the second oscillator to switch a plurality of capacitors of the bank.

18. The apparatus of claim 8, further comprising a coarse tuning module for the second oscillator comprising a bank of capacitors for tuning the second oscillator by selective switching into the second oscillator.

19. The apparatus of claim 8, wherein tuning frequency band of the second oscillator is above tuning frequency band of the first oscillator.

20. A method of generating signals comprising:
providing a first oscillator having a first inductor configured for use in an LC tank of the first oscillator;
providing a second oscillator having a second inductor configured for use in an LC tank of the second oscillator, the second conductor loosely coupled to the first inductor; and
operating a second oscillator control module configured to switch a second capacitance into the LC tank of the second oscillator when the second oscillator is inactive;
wherein switching the second capacitance into the LC tank of the second oscillator causes an oscillation mode of the first oscillator to change from a first mode to a second mode.

21. An apparatus comprising:
means for operating a frequency generator with a first oscillator and a second oscillator, wherein the second oscillator has a plurality of capacitors for coarse tuning the second oscillator, the first oscillator comprising a first inductor and the second oscillator comprising a second inductor loosely coupled to the first inductor; and means for activating the first oscillator while not activating the second oscillator; and means for loading an LC tank of the second oscillator with the plurality of capacitors when activating the first oscillator.

22. A non-transitory machine-readable medium comprising instructions executable by a processor for estimating symbols at a receiver, the processor-executable instructions comprising code for:

operating a frequency generator having a first oscillator and a second oscillator, wherein the second oscillator has a plurality of capacitors for coarse tuning the second oscillator, the first oscillator comprising a first inductor and the second oscillator comprising a second inductor loosely coupled to the first inductor; and activating the first oscillator while not activating the second oscillator; and causing the loading of an LC tank of the second oscillator with the plurality of capacitors when activating the first oscillator.

* * * * *